United States Patent [19]
Adan et al.

[11] Patent Number: 5,145,796
[45] Date of Patent: Sep. 8, 1992

[54] METHOD FOR MANUFACTURING A SEMICONDUCTOR APPARATUS

[75] Inventors: Alberto Adan, Tenri; Masayoshi Horita, Yamatokoriyama, both of Japan

[73] Assignee: Sharp Kabushiki Kaisha, Japan

[21] Appl. No.: 749,558

[22] Filed: Aug. 26, 1991

[30] Foreign Application Priority Data

Aug. 27, 1990 [JP] Japan .................... 2-227068

[51] Int. Cl.[5] .......................... H01L 21/265
[52] U.S. Cl. ............................ 437/40; 437/62; 437/69; 437/89; 437/913; 437/915; 148/DIG. 53; 148/DIG. 150
[58] Field of Search ........ 437/40, 913, 43, 42, 437/62, 67, 72, 64, 65, 84, 89, 90, 91, 92, 915; 148/DIG. 53

[56] References Cited

U.S. PATENT DOCUMENTS

| | | | |
|---|---|---|---|
| 4,530,149 | 7/1985 | Jastrzebski et al. | 437/90 |
| 4,692,994 | 9/1987 | Moniwa et al. | 437/40 |
| 4,751,557 | 6/1988 | Sunami et al. | 437/915 |
| 4,820,654 | 4/1989 | Lee | 437/67 |
| 4,851,365 | 7/1989 | Jeuch | 437/40 |
| 4,925,805 | 5/1990 | Van Ommen et al. | 437/24 |
| 4,933,298 | 6/1990 | Hasegawa | 437/40 |
| 5,049,521 | 9/1991 | Belanger et al. | 437/62 |

OTHER PUBLICATIONS

"Thin Film Effects of Double-Gate Polysilicon MOS-FET", T. Hashimoto et al. Extended Abstracts of the 22nd (1990 International) Conference on Solid State Devices and Materials, Sendai, 1990, pp. 393-396.

*Primary Examiner*—Brian E. Hearn
*Assistant Examiner*—Michael Trinh
*Attorney, Agent, or Firm*—Nixon & Vanderhye

[57] ABSTRACT

A method for manufacturing a semiconductor apparatus, providing steps of (i) laminating a first polysilicon layer on the whole surface of a semiconductor substrate through a first oxide layer, (ii) removing the first polysilicon layer and first oxide layer in an element separation region so as to form a trench therein and to treat the residual first polysilicon layer and first oxide layer as a bottom gate electrode and an insulating film respectively, (iii) forming a monocrystalline silicon layer by epitaxial growth on the whole surface of the semiconductor substrate including the trenches, (iv) removing the monocrystalline silicon layer in the element separation region, laminating a second oxide layer on the whole surface of the semiconductor substrate including the removing portion, and making the second oxide layer remain as an element separation film in only the element separation region, and (v) forming a gate oxide film and a top gate electrode on the residual monocrystalline silicon film, and forming a source/drain region on the residual monocrystalline silicon film.

2 Claims, 3 Drawing Sheets

METHOD FOR MANUFACTURING A SEMICONDUCTOR APPARATUS

BACKGROUND OF THE INVENTION

1. Field of the Invention

The present invention relates to a method for manufacturing a semiconductor apparatus, and more particularly to a method for manufacturing a Double-Gated MOS Transistor.

2. Description of the Prior Art

MOS Transistors are widely used as components in Integrated Circuits (IC) due to their low power dissipation and possibility for high density integration.

However, several problems arise in the following respects:

(i) short-channel effects, and
(ii) isolation between opposite polarity MOSFETs.

To solve the first problem, very shallow junctions and higher channel concentrations are required. These are very difficult to be realized because of breakdown limitations.

The isolation between devices of opposite polarity is limited by latch-up in the conventional technology. As a result, the separation between devices is limiting the device scaling.

SUMMARY OF THE INVENTION

The present invention provides a method for manufacturing a semiconductor apparatus, comprising steps of (i) laminating a first polysilicon layer on the whole surface of a semiconductor substrate through a first oxide layer, (ii) removing the first polysilicon layer and first oxide layer in an element separation region so as to form a trench therein and to treat the residual first polysilicon layer and first oxide layer as a bottom gate electrode and an insulating film respectively, (iii) forming a monocrystalline silicon layer by epitaxial growth on the whole surface of the semiconductor substrate including the trenches, (iv) removing the monocrystalline silicon layer in the element separation region, laminating a second oxide layer on the whole surface of the semiconductor substrate including the removing portion, and making the second oxide layer remain as an element separation film in only the element separation region, and (v) forming a gate oxide film and a top gate electrode on the residual monocrystalline silicon film, and forming a source/drain region on the residual monocrystalline silicon film.

DETAILED DESCRIPTION OF A PREFERRED EMBODIMENT

According to the present invention, a monocrystalline silicon layer is grown so as to completely bury trenches by an epitaxial technology. As finally shown, transistors are laterally separated from each other by a CVD oxide film which is filled in the trench. Consequently, the characteristics of a Double-Gated MOS Transistor can be improved.

A $SiO_2$ insulating film and a bottom gate electrode are formed in a region other than a region (R). Consequently, the upper portion of a device is separated from a semiconductor substrate by a bottom gate electrode 3a in the lower portion of the device. Thus, a noise resistance can be enhanced.

Double-Gated MOS Thin Film Transistors (DGTFT) and a new isolation and epitaxial growth process are proposed to realize a CMOS process which eliminates the limitations of the conventional technology.

For the Double-Gated structure using lateral selective epitaxial growth, (i) transistors can be isolated from the substrate by the isulating effect of the bottom gate electrode,
(ii) the isolation between the transistors can be performed by the trench, and
(iii) the characteristics of the transistors can be enhanced by Double-Gated connection.

A preferred embodiment of the present invention will be described in more detailed with reference to the drawings. The present invention is not limited to the following embodiment.

A manufacturing method will be described below.

Figure 1:
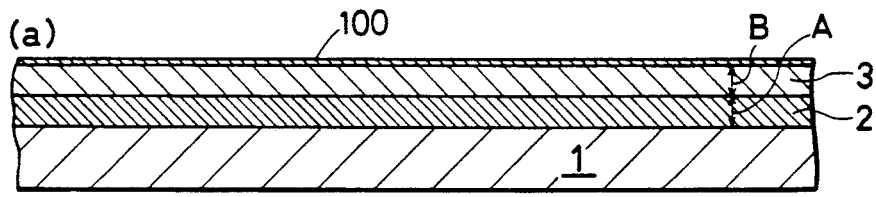
FIG. 1 is a view showing manufacturing steps according to an embodiment of the present invention.
Figure 1:
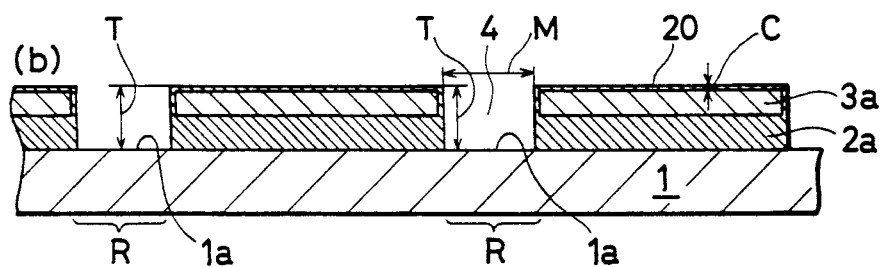
Figure 1:
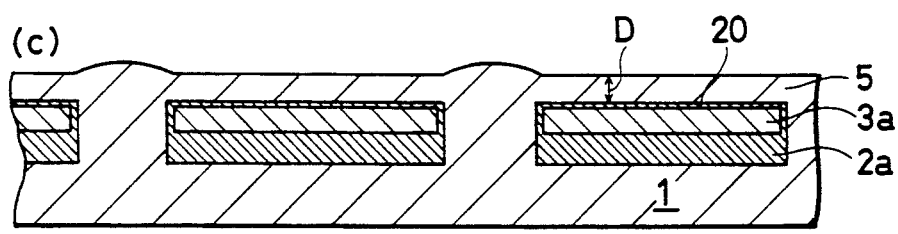
Figure 1:
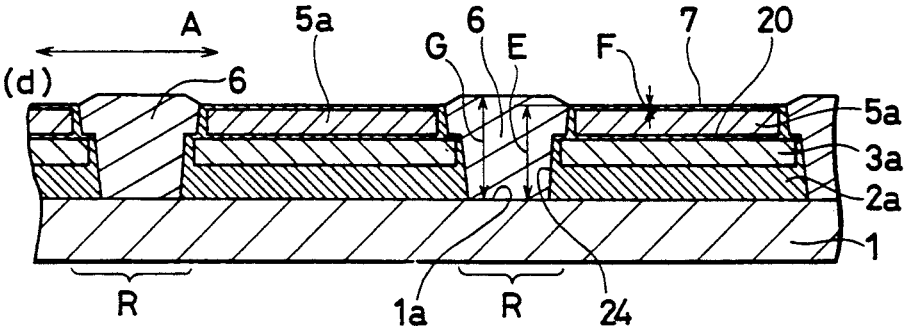
Figure 1E:
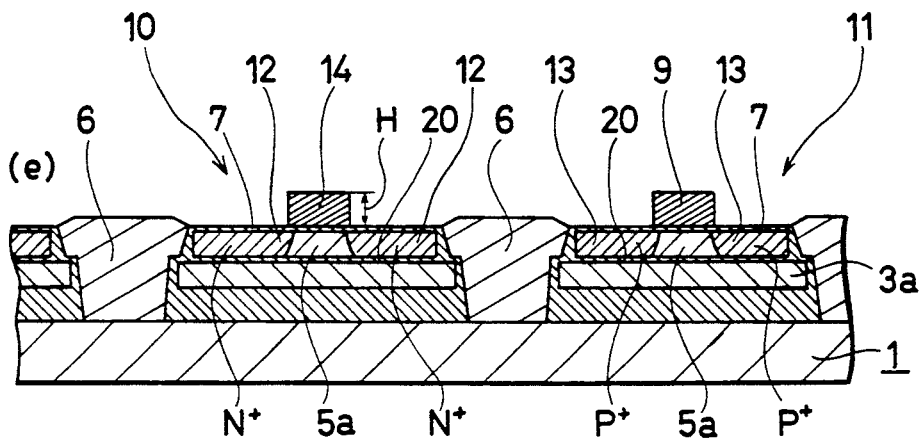
Figure 1F:
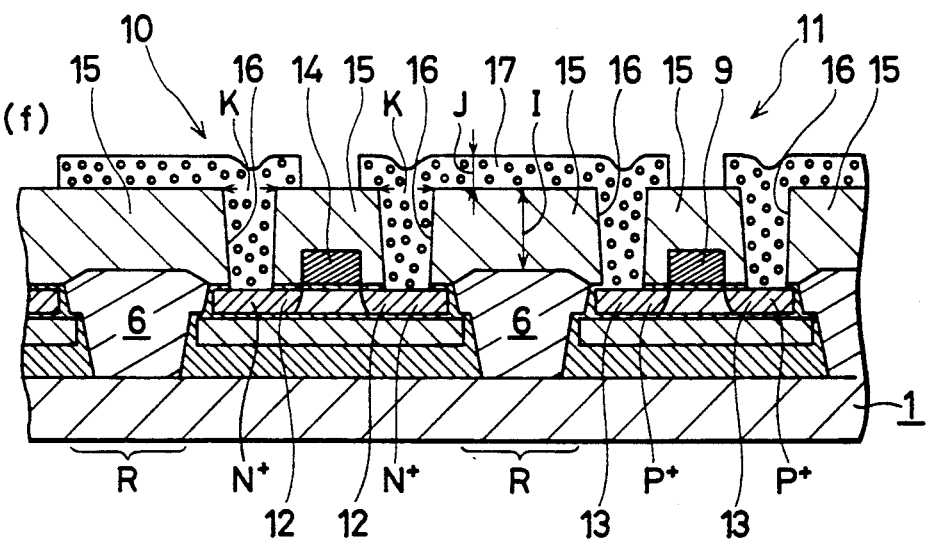

FIG. 1 shows steps of forming a Double-Gated CMOS device. As shown in FIG. 1(a), a $SiO_2$ film (first oxide film) 2 having a thickness A of 1000 Å is formed on a silicon substrate 1 so as to isolate a bottom gate electrode from the silicon substrate 1. A polysilicon layer 3 having a thickness B of 1000 Å is laminated as the bottom gate electrode on the $SiO_2$ film 2. And, an about 200 Å thermal $SiO_2$ layer (100) is grown on the polysilicon layer 3.

Then, the $SiO_2$ film 2 and polysilicon layer 3 in an element separation region (R) are patterned by a photo-etching technology so that the silicon substrate 1 in the region (R) is exposed. A trench 4 having a depth T of 2000 Å and an opening diameter M of 5000 Å formed in the region (R) on the silicon substrate 1. A $SiO_2$ insulating film 2a and a bottom gate electrode 3a are formed in regions other than the region (R) [see FIG. 1 (b)]. Subsequently, a $SiO_2$ oxide film 20 having a thickness C of 100 Å is formed by thermal oxidation on the whole surface of the silicon substrate 1 including the trenches 4. Then, the thermal oxide film formed on the bottom of the trench 4 is removed by anisotropic dry-etching. The thermal oxide film 20 formed on the side portions of the trench 4 is made to remain.

A monocrystalline silicon layer 5 having a thickness D of 1000 Å is grown on the whole surface of the silicon substrate 1 including the thin $SiO_2$ films 20 and trenches 4 in order to completely bury the trenches 4 by the epitaxial technology [see FIG. 1 (c)]. The monocrystalline silicon layer 5 forms a CMOS device body.

Then, using a photoresist mask, the monocrystalline silicon layer 5 is etched in the element separation region (R) between devices so as to form a monocrystalline silicon film 5a. A trench 24 having a depth E of 3000 Å is formed again. In this case, etching is carried out until a surface 1a of the silicon substrate 1 is exposed. Thereafter, a $SiO_2$ thermal oxide film 7 having a thickness F of 100 Å if formed by thermal oxidation on the whole surface of the silicon substrate 1 including the trenches 24.

A $SiO_2$ CVD oxide film 6 having a thickness G of 3000 Å is formed as an element separation film in the region (R) by deposition, reflow and etchback technologies using a CVD oxide film [see FIG. 1 (d)]. Consequently, device separation is performed.

In that case, the element separation film 6 buries the trench 24.

As a result, the transistors are laterally separated from each other in the direction of an arrow A by the CVD oxide film 6 which is filled on the trench 24.

The lower portions of the devices are separated from each other by the bottom gate polysilicon electrode 3a.

Figure 2:
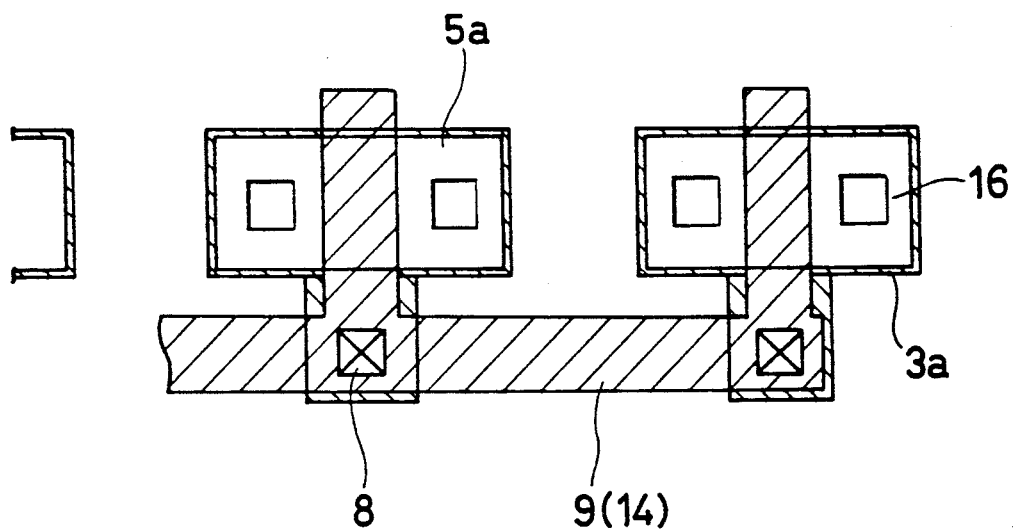
FIG. 2 is a view for explaining the structure of main portions according to the embodiment of the present invention.

As shown in FIG. 2, a contact window 8 is formed as a stack contact between the bottom gate polysilicon electrode 3a and a top gate polysilicon electrode to be formed hereafter.

As shown in FIG. 1 (e), a polysilicon layer having a thickness H of 2000 Å is laminated as a top gate electrode on the whole surface of the silicon substrate 1 including the element separation film 6. Then, the polysilicon layer is patterned. Consequently, top gate polysilicon electrodes 9 and 14 remain on only the monocrystalline silicon film 5a which remains through the $SiO_2$ film 7. Then, ions are selectively doped on the whole surface of the silicon substrate 1 including the top gate electrodes 9 and 14 by the known ion implantation using photoresist masks (not shown). Consequently, there are respectively formed sources and drains 12 and 13 of a NMOS Transistor 10 and a PMOS Transistor 11 [see FIG. 1 (e)].

As shown in FIG. 1 (f), insulating layers 15 having a thickness I of 5000 Å are laminated on the whole surface of the silicon substrate 1 including the top gate electrodes 9 and 14. A contact hole 16 is formed on the insulating layer 15. A metal layer having a thickness J of 4000 Å is laminated on the whole surface of the silicon substrate 1 including the contact holes 16. Then, the metal layer is patterned to form a metal film 17. Consequently, device interconnection is formed.

Thus, there can be produced a Double-Gated CMOS Inverter shown in FIG. 2.

According to the present embodiment, the monocrystalline silicon layer 5 is grown so as to completely bury the trenches 4 by the epitaxial technology as shown in FIG. 1 (c). Finally, the transistors 10 and 11 are laterally separated from each other in the direction of the arrow A by the CVD oxide film 6 which is filled in the trench 24 as shown in FIG. 1 (f). Consequently, the characteristics of the Double-Gated MOS Transistor can be improved.

The $SiO_2$ insulating film 2a and bottom gate electrode 3a are formed in the regions other than the region (R) [see FIG. 1 (b)]. Consequently, the upper active element of the device is separated from the silicon substrate 1 by the bottom gate electrode 3a in the lower portion of the device. Thus, the noise resistance can be enhanced.

In conventional CMOS technologies, the transistors are formed within the silicon substrate and are isolated by PN junctions (wells) and thick oxide films (LOCOS films). These technologies are limited by latch-up, shallow junction formation and breakdown. According to a novel manufacturing method of the present invention, there can be realized a Double-Gated CMOS device. Consequently, the following effects can be obtained.

(i) The Double-Gated CMOS Thin Film Transistors are superior to Single-Gated devices in the following respects;
1. a drive current can be enhanced,
2. a higher punchthrough voltage resistance can be obtained, and
3. short-channel degradation effects are reduced.

(ii) The bottom gate electrodes of the present invention are provided beneath the devices in order to insulate each active element, making this structure resistant to a substrate noise.

(iii) The transistor has the element separation film (for example, a CVD oxide film) in the minimum size trench. Consequently, the latch-up can be reduced and a packing density can be increased.

What is claimed is:

1. A method for manufacturing a semiconductor apparatus, comprising steps of
   (i) laminating a first polysilicon layer on a whole surface of a semiconductor substrate through a first oxide layer,
   (ii) removing the first polysilicon layer and first oxide layer in element separation regions so as to form trenches therein and to treat the residual first polysilicon layer and first oxide layer as a bottom gate electrode and an insulating film respectively,
   (iii) forming a monocrystalline silicon layer by epitaxial growth on a whole surface of the semiconductor substrate including the trenches,
   (iv) removing the monocrystalline silicon layer in the element separation regions so as to form openings, laminating a second oxide layer on a whole surface of the semiconductor substrate including the openings, and making the second oxide layer remain as element separation films in only the element separation regions, and
   (v) forming a gate oxide film and a top gate electrode on the residual monocrystalline silicon film, and forming source/drain regions in the residual monocrystalline silcion film.

2. A method for manufacturing a semiconductor apparatus according to claim 1, wherein the insulating film is a $SiO_2$ film.

* * * * *